(12) United States Patent
Yamamoto et al.

(10) Patent No.: US 7,863,805 B2
(45) Date of Patent: Jan. 4, 2011

(54) DIAMOND ELECTRON EMISSION CATHODE, ELECTRON EMISSION SOURCE, ELECTRON MICROSCOPE, AND ELECTRON BEAM EXPOSURE DEVICE

(75) Inventors: Yoshiyuki Yamamoto, Itami (JP); Akihiko Ueda, Itami (JP); Yoshiki Nishibayashi, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 712 days.

(21) Appl. No.: 11/665,472

(22) PCT Filed: Jun. 19, 2006

(86) PCT No.: PCT/JP2006/312263
§ 371 (c)(1),
(2), (4) Date: Sep. 24, 2007

(87) PCT Pub. No.: WO2006/135094
PCT Pub. Date: Dec. 21, 2006

(65) Prior Publication Data
US 2008/0067493 A1 Mar. 20, 2008

(30) Foreign Application Priority Data

Jun. 17, 2005 (JP) ............................. 2005-178163
Sep. 6, 2005 (JP) ............................. 2005-257452
Sep. 6, 2005 (JP) ............................. 2005-257791

(51) Int. Cl.
H01J 1/02 (2006.01)
H01J 9/02 (2006.01)
H01J 1/62 (2006.01)
H01J 63/04 (2006.01)

(52) U.S. Cl. ...................... 313/495; 313/311; 313/309; 313/310; 313/336; 313/351; 313/346 R

(58) Field of Classification Search ...................... None
See application file for complete search history.

(56) References Cited

U.S. PATENT DOCUMENTS 5,552,613 A * 9/1996 Nishibayashi et al. ......... 257/10

(Continued)

FOREIGN PATENT DOCUMENTS

EP 0 645 793 A2 3/1995

(Continued)

OTHER PUBLICATIONS

European Search Report issued in European Patent Application No. EP 06766924.2 dated May 10, 2010.

(Continued)

*Primary Examiner*—Nimeshkumar D Patel
*Assistant Examiner*—Natalie K Walford
(74) *Attorney, Agent, or Firm*—McDermott Will & Emery LLP

(57) ABSTRACT

It is possible to provide an electron emission cathode, an electron emission source having a high-luminance and narrow energy width by using diamond and an electronic device using them. The diamond electron discharge cathode has a monocrystal diamond at least at a part of it. The diamond electron emission cathode has a columnar shape including a sharpened section and a heating section. The sharpened section has an electron emission section. The electron emission section and the heating section are formed by diamond semiconductor, which is formed by a p-type semiconductor containing $2\times10^{15}$ cm$^{-3}$ of p-type impurities or above. The electron emission section has the semiconductor. A metal layer is formed on the surface of the electron emission cathode. The metal layer exists at least at a part of the heating section. The distance from the electron emission section to the position nearest to the end of the metal layer is 500 μm. A pair of current introduction terminals supplies current to the heating section to heat the heating section. A part of the introduced electrons is emitted from the electron emission section.

59 Claims, 9 Drawing Sheets

U.S. PATENT DOCUMENTS

| | | | |
|---|---|---|---|
| 6,876,136 B2 * | 4/2005 | Nishibayashi et al. | 313/309 |
| 6,958,571 B2 | 10/2005 | Nishibayashi et al. | |
| 7,307,377 B2 * | 12/2007 | Tatsumi et al. | 313/309 |
| 7,710,013 B2 * | 5/2010 | Tatsumi et al. | 313/495 |
| 2002/0031913 A1 | 3/2002 | Nishibayashi et al. | |
| 2004/0095051 A1 * | 5/2004 | Nishibayashi et al. | 313/309 |
| 2008/0048544 A1 * | 2/2008 | Ueda et al. | 313/341 |
| 2008/0116446 A1 * | 5/2008 | Yamamoto et al. | 257/10 |

FOREIGN PATENT DOCUMENTS

| | | |
|---|---|---|
| EP | 1 401 006 A2 | 3/2004 |
| EP | 1 670 016 A1 | 6/2006 |
| JP | 62-140332 | 6/1987 |
| JP | 64-007450 | 1/1989 |
| JP | 4-67527 | 3/1992 |
| JP | 9-199001 | 7/1997 |
| JP | 2002-075171 | 3/2002 |
| JP | 2005-108637 | 4/2005 |
| JP | 2005-135852 | 5/2005 |
| WO | WO 2005/034164 A1 | 4/2005 |

OTHER PUBLICATIONS

International Preliminary Report on Patentability and Written Opinion of the International Searching Authority, issued in International Application No. PCT/JP2006/312263, dated on Jan. 3, 2008.

Himpsel, et al., "Quantum photoyield of diamond(111)-A stable negative-affinity emitter", Physical Review B, Jul. 15, 1979, pp. 624-627, vol. 20, No. 2, The American Physical Society.

Ristein, et al., "The Role of Adsorbates and Defects on Diamond Surfaces", New Diamond and Frontier Carbon Technology, 2000, pp. 363-382, vol. 10, No. 6, Myu Tokyo.

Nishibayashi, et al., "Development of "Diamond Nano-Emitters"", SEI Technical Review, Jan. 2004, pp. 31-36, No. 57.

Choi, et al., "Field emission from diamond coated molybdenum field emitters", J. Vac. Sci. Technol. B, May/Jun. 1996, pp. 2050-2055, vol. 14, No. 3, American Vacuum Society.

\* cited by examiner

US 7,863,805 B2

DIAMOND ELECTRON EMISSION CATHODE, ELECTRON EMISSION SOURCE, ELECTRON MICROSCOPE, AND ELECTRON BEAM EXPOSURE DEVICE

RELATED APPLICATIONS

This application is the U.S. National Phase under 35 U.S.C. § 371 of International Application No. PCT/JP2006/312263 filed Jun. 19, 2006, which claims the benefit of Japanese Application Nos. 2005-178163 filed Jun. 17, 2005, 2005-257452 filed Sep. 6, 2005, and 2005-257791 filed Sep. 6, 2005, the disclosures of which Applications are incorporated by reference herein.

TECHNICAL FIELD

The present invention relates to a diamond electron emission cathode and an electron emission source for use in electron ray and electron beam devices such as electron microscopes and electron beam exposure devices and also in vacuum tubes such as traveling wave tubes and microwave tubes and also to electronic devices using such cathode and source.

BACKGROUND ART

Because an electron bears a negative charge and has a very small mass, electron beams in which electrons are arranged to travel in one direction have the following special features. (1) The direction and the degree of convergence can be controlled by an electric or magnetic field. (2) Energy in a wide range can be obtained by acceleration and deceleration with an electric field. (3) Because the wavelength is short, the beam can be converged to a small diameter. Electron microscopes and electron beam exposure devices employing such special features have been widely used. As cathode materials for such devices, cheap W filaments or hexaborides, e.g., $LaB_6$ which can produce an electron beam with a high brightness, are exemplified for thermal electron emission sources. Further, W with a sharpened tip end that uses a tunnel phenomenon based on a quantum effect and ZrO/W using the Schottky effect based on electric filed application have been used as cathodes with a high brightness and a narrow energy width.

However, although W filaments are inexpensive, the service life thereof is extremely short (about 100 hours). The resultant problem is that a replacement operation such as opening a vacuum container to the atmosphere or adjusting the optical axis of electron beam when the filament is broken has to be frequently performed. The service life of $LaB_6$ is about 1000 hours and longer than that of W filaments, but because it is used in devices in which beams with a comparatively high brightness are obtained, the replacement operation is most often performed by the device manufacturers and the cost thereof is high. A problem associated with ZrO/W that has a comparatively long service life (about one year) and W with a sharpened tip end that allows a higher brightness to be obtained is that the replacement cost is high.

Because electron microscopes are presently required to enable highly accurate observations of even smaller objects and because the development of electron beam exposure devices advanced to a node size of less than 65 nm, the cathodes with even higher brightness and narrower energy width are needed.

Diamond is a material that meets such expectations. Diamond exists in a state with a negative electron affinity (NEA) or in a state with a positive electron affinity (PEA) less than that of metals with a small work function, as described in Non-Patent Document 1 and Non-Patent Document 2. By employing such an extremely rare physical property, it is possible to obtain electron emission with a high current density and to reduce the energy width, without requiring a high temperature in excess of 1000° C. as in W filaments, $LaB_6$, or ZrO/W. Further, because the operation temperature is low, a long service life can be expected. In addition, because there is a microprocessing technology that can produce a tip end diameter of 10 nm, as described in Non-Patent Document 3, no problems are associated with increase in brightness. Since diamond has been found to have the aforementioned electron affinity, electron sources as described in Non-Patent Document 4 and Patent Document 1 have been proposed.

Non-Patent Document 1: F. J. Himpsel et al., Phys. Rev. B, Vol. 20, Number 2 (1979), 624

Non-Patent Document 2: J. Ristein et al., New Diamond and Frontier Carbon Technology, Vol. 10, No. 6, (2000) 363-

Non-Patent Document 3: Y. Nishibayashi et al., SEI Technical Review, 57, (2004) 31-

Non-Patent Document 4: W. B. Choi et al., J. Vac. Sci. Technol. B14 (1966) 2051-

Patent Document 1: Japanese Patent Publication No. 4-67527A

DISCLOSURE OF THE INVENTION

Problems that the Invention is to Solve

However, the following problems are encountered when electron sources using diamond are employed in electronic microscopes or electron beam exposure devices that have become widely spread. Thus, structures in which a plurality of electron emission points, such as described in Non-Patent Document 3, are arranged side by side become plane electron sources and a small-diameter beam is difficult to obtain by converging. Mounting on the device is also a difficult task. No problems are associated with the shape when Mo with a sharp tip end is coated with diamond, as described in Non-Patent Document 4, but because of a polycrystalline structure there are differences among individual species and a spread in electric characteristics. Because the structure suggested in Non-Patent Document 1 is also a plane electron source, a converged beam is difficult to obtain. Such source is also difficult to mount on the device.

Accordingly, with the foregoing in view, it is an object of the present invention to provide an electron emission cathode and an electron emission source using diamond and having a high brightness and a small energy width that are suitable for electron ray and electron beam devices and vacuum tubes, in particular, electron microscopes and electron beam exposure devices, and to an electron microscope and an electron beam exposure device that use such electron emission cathode and electron emission source.

Means for Solving the Problems

In order to resolve the above-described problems, the diamond electron emission cathode in accordance with the present invention adopts the following configuration.

(1) A diamond electron emission cathode in accordance with the present invention is a diamond electron emission cathode comprising a single crystal diamond in at least part thereof, the diamond electron emission cathode having a columnar shape which has a heating section and a sharpened acute section having one electron emitting portion, a semiconductor comprising a diamond is present therein, the semiconductor is a p-type semiconductor comprising p-type impurities at $2\times10^{15}$ cm$^{-3}$ or higher, the semiconductor is present in the electron emitting portion, a metal layer is formed on a surface of the electron emission cathode, the metal layer is present in at least part of the heating section, the shortest distance from the electron emitting portion to an end portion of the metal layer is 500 µm or less, an electric current for heating is supplied to the heating section with a pair of current introducing terminals, and some of the introduced electrons can be emitted from the electron emitting portion.

Such diamond electron emission cathode contains almost no dissimilar materials. Therefore, cathode fracture during heating and cooling caused by the difference in thermal expansion coefficients is prevented. The term "almost" used herein indicates the case where the cathode shape of the diamond electron emission cathode does not depend on any material other than diamond. Accordingly, this excludes the case where the cathode shape, except the below-described heating section, mainly depends on a material other than diamond, as in the shape in which diamond is coated on Mo having a sharpened tip end, as described in Non-Patent Document 4. Further, because at least part of the diamond electron emission cathode is composed of single crystal diamond, the doping concentration of p-type impurities that are necessary to use diamond as a cathode material can be controlled in the process of vapor-phase growing the diamond, this control being difficult with the polycrystalline materials. Further, the removal of moisture or the like that has adhered to the surface of the sharpened acute section, such operation being necessary for stabilizing the emission current, can be performed in an easy manner by heating via the heating section. In addition, because of a columnar shape having a sharpened acute section with one electron emitting portion, an electron emission cathode with a high brightness can be fabricated.

In the diamond electron emission cathode in accordance with the present invention, the electron emitting portion is a p-type semiconductor. The p-type semiconductor diamond has a small electron affinity of the surface thereof and the conduction band thereof is bent to a low energy side of electrons. As a result, if electrons can be efficiently injected into the conduction band of the p-type semiconductor diamond surface, then electron emission can be induced at a high density. In accordance with the present invention, the metal layer is formed as far as the vicinity of the electron emitting portion whereby electron injection into the conduction band of the p-type semiconductor diamond of the electron emitting portion surface can be facilitated. By forming the metal layer as far as the vicinity of the electron emitting portion, the injected electrons reach the electron emitting portion and are emitted before they recombine.

In the diamond electron emission cathode in accordance with the present invention, a metal layer is formed on the surface thereof and the shortest distance from the electron emitting portion to an end portion of the metal layer is 500 µm or less. In the p-type semiconductor, no electrons are present in the conduction band, but because a large number of electrons can be transported to the electron emitting portion if a metal layer is formed as far as the vicinity of the electron emitting portion, the supplied electrons reach the electron emitting portion and are emitted before they recombine. Therefore, high-efficiency electron emission is realized. Furthermore, the power source voltage for heating can be decreased and the cathode becomes suitable for mounting on electron beam devices such as electron microscopes and electron beam exposure devices. The distance to the end portion of the metal layer of 100 µm or less is even more preferred. The improvement of electron transport efficiency to the electron emitting portion attained by providing a metal coating on the electron emission cathode is even more significant.

Further, in the diamond electron emission cathode in accordance with the present invention, an electric current can be supplied to the heating section with a pair of current introducing terminals. Therefore, replaceability with the conventional electron sources such as W filaments, LaB$_6$, or ZrO/W can be attained, and the electron emission cathode in accordance with the present invention can be installed in electronic devices, e.g., in the already existing electron microscopes and electron beam exposure devices.

(2) A diamond electron emission cathode in accordance with the present invention is a diamond electron emission cathode comprising a single crystal diamond in at least part thereof, the diamond electron emission cathode having a columnar shape which has a heating section and a sharpened acute section having one electron emitting portion, a semiconductor comprising a diamond is present therein, the semiconductor is an n-type semiconductor comprising n-type impurities at $2\times10^{15}$ cm$^{-3}$ or higher, the semiconductor is present in the electron emitting portion, a metal layer is formed on a surface of the electron emission cathode, the metal layer is present in at least part of the heating section, the shortest distance from the electron emitting portion to an end portion of the metal layer is 500 µm or less, an electric current for heating is supplied to the heating section with a pair of current introducing terminals, and some of the introduced electrons can be emitted from the electron emitting portion.

In the diamond electron emission cathode in accordance with the present invention, the electron emitting portion is an n-type semiconductor comprising n-type impurities at $2\times10$ cm$^{-3}$ or higher and having a low specific resistance. When the electron emitting portion is constituted of an n-type semiconductor, the electrons supplied from a pair of current introducing terminals are transported only by the diamond semiconductor in which electrons are the major carrier and released from the electron emitting portion into vacuum. Electron transport from the current introducing terminals into the electron emitting portion is performed with good efficiency and electrons are present as carriers in the conduction band. Therefore, the introduced electrons can be emitted from the electron emitting portion with a high current density.

In the diamond electron emission cathode in accordance with the present invention, a metal layer is formed on the cathode surface and the shortest distance from the electron emitting portion to an end portion of the metal layer is 500 µm or less. In the n-type diamond semiconductor, although electrons are present in the conduction band, the resistance is large by comparison with that of the metal layer and the resistance value from a pair of the current introducing terminals to the electron emitting portion increases and, therefore, becomes a factor impeding a large-current emission. In accordance with the present invention, by forming a metal layer as far as the vicinity of the electron emitting portion, the resistance value from a pair of the current introducing terminals to the electron emitting portion can be decreased, whereby a large-current emission is made possible. Furthermore, the power source voltage for heating can be decreased and the cathode becomes suitable for mounting on electron beam devices such as electron microscopes and electron beam exposure devices. The distance to the end portion of the metal layer of 100 µm or less is even more preferred. With such a distance, the improvement of electron transport efficiency to the electron emitting portion attained by providing a metal coating on the electron emission cathode is even more significant.

(3) A diamond electron emission cathode in accordance with the present invention is a diamond electron emission cathode comprising a single crystal diamond in at least part thereof, the diamond electron emission cathode having a columnar shape which has a heating section and a sharpened acute section having one electron emitting portion, a semiconductor comprising a diamond is present therein, the semiconductor is an intrinsic semiconductor with a carrier concentration of $1 \times 10^9$ cm$^{-3}$ or lower at 300 K, the semiconductor is present in the electron emitting portion, a metal layer is formed on a surface of the electron emission cathode, the metal layer is present in at least part of the heating section, the shortest distance from the electron emitting portion to an end portion of the metal layer is 500 μm or less, an electric current for heating is supplied to the heating section with a pair of current introducing terminals, and some of the introduced electrons can be emitted from the electron emitting portion.

In the diamond electron emission cathode in accordance with the present invention, the electron emitting portion is an intrinsic semiconductor. When the electron emitting portion is an intrinsic semiconductor, the conduction band of the surface thereof becomes flat in terms of energy for the electrons and assumes a negative electron affinity. Furthermore, because the concentration of holes serving as partners for recombination of electrons in the conduction band is small, the recombination probability is extremely low. As a result, if the electrons are injected into the conduction band in the vicinity of the electron emitting portion surface, the electrons can be emitted with an extremely high efficiency. In this invention, the metal layer is formed as far as the vicinity of the electron emitting portion, whereby the injection of electrons into the conduction band of the intrinsic semiconductor diamond of the electron emitting portion surface can be facilitated.

Further, because the intrinsic semiconductor has a high resistance, the resistance value from a pair of the current introducing terminals to the electron emitting portion becomes extremely high, thereby impeding a large-current emission. The resistance value from a pair of the current introducing terminals to the electron emitting portion can be decreased by a metal layer formed on the surface. Furthermore, the power source voltage for heating can be decreased.

(4) In the diamond electron emission cathode in accordance with the present invention, the diamond-comprising semiconductor is formed by at least two types of semiconductors that differ in electric properties, one of the types constituting the diamond semiconductors is a p-type semiconductor comprising p-type impurities at $2 \times 10^{15}$ cm$^{-3}$ or higher, the other one is an intrinsic semiconductor with a carrier concentration of $1 \times 10^9$ cm$^{-3}$ or lower at 300 K, and the intrinsic semiconductor is present in the electron emitting portion.

"Different electric properties" as referred to herein means that semiconductors differ in a semiconductor conduction type, specific resistance, effective work function, electron affinity, or the like due to a difference in the type or concentration of impurities in the diamond. By appropriately combining such properties, an electron emission cathode with high efficiency can be realized. With a diamond semiconductor, a comparatively shallow acceptor level of p-type impurities and a low resistance are easily obtained and a small or negative electron affinity is easily obtained. Therefore, a p-type semiconductor containing p-type impurities at $2 \times 10^{15}$ cm$^{-3}$ or higher is suitable therefor. Using a semiconductor with a low specific resistance decreases the specific resistance of the entire electron emission cathode. Therefore, when the cathode is used at the same temperature as that of the electron emission cathode with a comparatively high specific resistance, the current for resistance heating (i.e., heating by conduction) can be increased. As a result, the electrons reaching the electron emitting portion is increased and electron emission efficiency is advantageously improved.

"Different electric properties" as referred to herein means that semiconductors differ in a semiconductor conduction type, specific resistance, effective work function, electron affinity, or the like due to a difference in the type or concentration of impurities in the diamond. By appropriately combining such properties, an electron emission cathode with high efficiency can be realized.

In this invention, a p-type semiconductor diamond and an intrinsic semiconductor are combined. The p-type semiconductor diamond has a resistance value lower than that of an n-type semiconductor diamond and advantageously provides for a large emission current. The electron emitting portion is formed by an intrinsic semiconductor diamond. When the electron emitting portion is an intrinsic semiconductor, the conduction band of the surface thereof becomes flat in terms of energy for the electrons and assumes a negative electron affinity. Furthermore, because the concentration of holes serving as partners for recombination of electrons in the conduction band is small, the recombination probability is extremely low. As a result, even if the electrons are injected into the conduction band in the vicinity of the electron emitting portion surface, the electrons can be emitted with an extremely high efficiency.

In this invention, the metal layer is formed as far as the vicinity of the electron emitting portion, whereby the injection of electrons into the conduction band of the intrinsic semiconductor diamond of the electron emitting portion surface can be facilitated.

Further, because the intrinsic semiconductor has a high electric resistance, the electric resistance from a pair of the current introducing terminals to the electron emitting portion becomes extremely high, thereby impeding a large-current emission. In the present invention, the electric resistance value from a pair of the current introducing terminals to the electron emitting portion can be decreased by being in combination with a p-type semiconductor diamond and by a metal layer formed on the surface. Furthermore, the power source voltage for heating can be decreased.

(5) In the diamond electron emission cathode in accordance with the present invention, the diamond-comprising semiconductor is formed by at least two types of semiconductors that differ in electric properties, one of the types constituting the diamond semiconductors is an n-type semiconductor comprising n-type impurities at $2 \times 10^{15}$ cm$^{-3}$ or higher, the other type is an intrinsic semiconductor with a carrier concentration of $1 \times 10^9$ cm$^{-3}$ or lower at 300 K, and the intrinsic semiconductor is present in the electron emitting portion.

"Different electric properties" as referred to herein means that semiconductors differ in a semiconductor conduction type, specific resistance, effective work function, electron affinity, or the like due to a difference in the type or concentration of impurities in the diamond. By appropriately combining such properties, an electron emission cathode with high efficiency can be realized.

In this invention, an n-type semiconductor diamond and an intrinsic semiconductor are combined. In the n-type semiconductor diamond, electrons are present in the conduction band, thereby advantageously enabling the electron emission. The electron emitting portion is formed by an intrinsic semiconductor diamond. When the electron emitting portion is an intrinsic semiconductor, the conduction band of the surface thereof becomes flat in terms of energy for the electrons and assumes a negative electron affinity. Furthermore, because the concentration of holes serving as partners for recombination of electrons in the conduction band is small, the recombination probability is extremely low. As a result, even if the electrons are injected into the conduction band in the vicinity of the electron emitting portion surface, the electrons can be emitted with an extremely high efficiency.

In this invention, the electrons present in the conduction band of the n-type semiconductor diamond are injected into the conduction band of the intrinsic semiconductor of the electron emitting portion and electron emission is performed with good efficiency.

Further, because the intrinsic semiconductor has a high resistance, the resistance value from a pair of the current introducing terminals to the electron emitting portion becomes extremely high, thereby impeding a large-current emission. In this invention, the intrinsic semiconductor is combined with the n-type semiconductor diamond and a metal layer is present on the surface. Therefore, the resistance value from a pair of the current introducing terminals to the electron emitting portion can be decreased by a metal layer formed on the surface. Furthermore, the power source voltage for heating can be decreased.

(6) In the diamond electron emission cathode in accordance with the present invention, the length in the short side direction of the entire diamond electron emission portion is 0.05 mm or more to 2 mm or less and the aspect ratio is 1 or more. With such a shape, the cathode can be easily mounted on an electron beam device such as electron microscope and electron beam exposure device. The "length in the short side direction" as referred to herein indicates a total width of the bottom section on the side opposite the electron emitting portion of the diamond electron emission cathode. When the diamond electron emission cathode is a rectangular parallelepiped, this direction indicates a short side of the total width of the bottom section. The "aspect ratio" as referred to herein is a ratio of the length in the longitudinal direction to that in the short side direction, where the length from the tip end of the electron emitting portion to the bottom section on the opposite side is taken as the longitudinal direction.

(7) In the diamond electron emission cathode in accordance with the present invention, at least one plane of the planes which form the electron emitting portion as an apex in the sharpened acute section, is formed by a (111) crystal plane [including off-planes within ±7° from the (111) just plane]. The stable growth plane in the vapor phase growth is a (100) plane or (111) plane, but the n-type dopant intake efficiency of the (111) plane in the vapor phase growth process is 10 or more times that of the (100) plane. It means that the (111) crystal plane of diamond enables high-concentration doping with n-type impurities, a metallic conduction can be easily obtained, and electron emission at a high current density can be obtained. Therefore, in the case where the electron emitting portion has a (111) crystal plane, a high-brightness electron emission cathode can be easily obtained.

(8) In the diamond electron emission cathode in accordance with the present invention, a surface of the diamond constituting the electron emitting portion is preferably terminated with hydrogen atoms. By terminating the dangling bonds of the diamond surface with hydrogen atoms, the electron affinity is reduced. Alternatively, the effective work function is reduced. As a result, highly efficient electron emission is realized. Terminating 50% or more of the dangling bonds of the diamond surface of the electron emitting portion with hydrogen atoms is especially effective.

(9) In the diamond electron emission cathode in accordance with the present invention, a portion comprising the n-type semiconductor preferably has a specific resistance of 300 Ωcm or less at 300 K (at room temperature). In this case, electrons can be efficiently supplied to the portion comprising the n-type impurities. As a result, a high-density electron emission is possible and a high-brightness electron emission cathode can be obtained. The "specific resistance at room temperature" as referred to herein indicates a specific resistance in the vicinity of the electron emitting portion.

(10) In the diamond electron emission cathode in accordance with the present invention, a tip end radius or a tip end curvature radius of the tip end section having the electron emitting portion is preferably 30 μm or less. By making the tip end portion, which serves as the electron emitting portion, in such a small size, an electron emission cathode with a higher brightness can be obtained.

(11) In the diamond electron emission cathode in accordance with the present invention, it is preferred that the electron emitting portion have a protruding structure, a tip end diameter of the protrusion be 5 μm or less, and an aspect ratio thereof be 2 or more. When only the electron emitting portion of the entire diamond single crystal serving as an electron emission cathode has such a sharpened acute end shape, it is possible to realize a high-brightness diamond thermal filed emission cathode or diamond field-emission cathode that can be easily mounted on an electron microscope, electron beam exposure device, or the like.

(12) In the diamond electron emission cathode in accordance with the present invention, a temperature during electron emission is preferably 400 K or more to 1200 K or less. Even more preferably, this temperature is 400 K or more to 900 K or less. With the temperature during electron emission within this temperature range, both the electron emission current and the service life can be improved over those of the conventional electron sources.

(13) In the diamond electron emission cathode in accordance with the present invention, an electron beam with an energy width of 0.6 eV or less may be emitted. A diamond electron emission cathode with a good electron beam can be provided.

(14) A diamond electron emission source in accordance with the present invention is a structure for mounting the diamond electron emission source in accordance with the present invention on an electron microscope or electron beam exposure device, this structure comprising the diamond electron emission cathode in accordance with the present invention, an insulating ceramic, and a pair of terminals for supplying an electric current to the diamond electron emission cathode, wherein a resistance value between the terminals is preferably 10 Ω or more to 3 kΩ or less. In this case, the diamond electron emission cathode in accordance with the present invention can be mounted without special modifications on the power source system of electron beam devices where the conventional cathode materials have been used.

(15) A diamond electron emission source in accordance with the present invention is a structure for mounting the diamond electron emission cathode in accordance with the present invention on an electron microscope or electron beam exposure device, this structure comprising the diamond electron emission cathode in accordance with the present invention, an insulating ceramic, and a pair of terminals for supplying an electric current to the diamond electron emission cathode, wherein a resistance value between the terminals is preferably 10 Ω or more to 700 Ω or less. In this case, the diamond electron emission cathode in accordance with the present invention can be mounted without special modifications on the power source system of electron beam devices where the conventional cathode materials have been used and an electron emission source can be obtained which has a brightness higher than that attained with the diamond electron emission cathode without the metal layer.

(16) Further, a diamond electron emission source in accordance with the present invention is a structure for mounting the diamond electron emission cathode in accordance with the present invention on an electron microscope or electron beam exposure device, this structure comprising the diamond electron emission cathode in accordance with the present invention, an insulating ceramic, and a pair of support terminals that clamp the diamond electron emission cathode, fix it to the insulating ceramic, and supply an electric current to the diamond electron emission cathode, wherein the support terminals are brought into direct contact with the diamond electron emission cathode.

In such diamond electron emission source, the diamond electron emission cathode, which is formed of a novel cathode material, can be easily installed as a replacement in the electron beam devices that have been using W filaments, $LaB_6$, or sharpened W, ZrO/W, which are the conventional cathode materials. Moreover, due to the structure in which the support terminals directly clamp the diamond electron emission cathode, the optical axes can be easily aligned during fabrication of the diamond electron emission source and the possibility of displacement or separation during use is very low.

(17) The melting point of a metal used for the pair of terminals or support terminals in the diamond electron emission source in accordance with the present invention is preferably 1700 K or less. Because electron emission from diamond is possible at a temperature lower than that of W filaments, $LaB_6$, or ZrO/W, a metal with a low melting point can be used and an electron emission source can be constructed by using a low-cost metal material.

(18) An electron microscope in accordance with the present invention comprises the diamond electron emission cathode or diamond electron emission source in accordance with the present invention. Because the diamond electron emission cathode or diamond electron emission source in accordance with the present invention makes it possible to obtain an electron beam with a high current density, high brightness, and low energy width, observations can be performed at a magnification ratio higher than that in the electron microscopes using the conventional cathode materials.

(19) An electron beam exposure device in accordance with the present invention comprises the diamond electron emission cathode or diamond electron emission source in accordance with the present invention. Because the diamond electron emission cathode or diamond electron emission source in accordance with the present invention makes it possible to obtain an electron beam with a high current density, high brightness, and low energy width, a fine pattern can be drawn at a higher throughput than in the electron beam exposure devices using the conventional cathode material.

Effects of the Invention

With the present invention, it is possible to realize a high-efficiency electron emission cathode and electron emission source that is suitable for devices of all types using electron beams, such as vacuum tubes, electron beam analyzers, accelerators, electron beam irradiation devices for sterilization, X-ray generators, irradiation devices for resins, and electron beam heating devices. In particular, it is possible to realize an electron emission cathode and electron emission source that use diamond, have a high brightness and a small energy width and are suitable for electron microscopes and electron beam exposure devices. Furthermore, by using the electron emission cathode and electron emission source, it is possible to realize an electron microscope enabling high-magnification observations and an electron beam exposure device in which fine patterns can be drawn at a high throughput.

BEST MODE FOR CARRYING OUT THE INVENTION

The preferred modes for carrying out the diamond electron emission cathode, electron emission source, electron microscope, and electron beam exposure device in accordance with the present invention will be described hereinbelow in greater detail with reference to the appended drawings. In the explanation of the drawings, identical elements will be assigned with identical reference symbols and the redundant explanation will be avoided. The dimensional ratio in the drawings does not necessarily match that in the description.

FIG. 1 is a perspective view illustrating an embodiment of the diamond electron emission cathode in accordance with the present invention. The diamond electron emission cathode 10 uses single crystal diamond in at least part thereof. A natural single crystal, a single crystal artificially synthesized by a high-temperature high-pressure synthesis method or vapor phase synthesis method, or a combination of such single crystals may be used as the single crystal diamond.

As shown in FIG. 1, the diamond electron emission cathode 10 is configured to have a columnar shape with a sharpened acute section having one electron emitting portion 4. A metal layer 6 is formed on the surface of the diamond electron emission cathode 10, and a heating section 5 is located in the metal layer 6.

FIG. 2 is a three-plane view illustrating the diamond electron emission cathode 10 shown in FIG. 1. FIG. 2(a) is a plan view, (b) is a front view, (c) is a right side view. The diamond electron emission cathode 10 shown in a plan view of FIG. 2 has the electron emitting portion 4 and heating section 5. The entire outer peripheral surface of the diamond electron emission cathode 10 is covered with the metal layer 6.

As shown in FIG. 2(c), the shortest distance (1) from the distal end of the electron emitting portion 4 to an end portion of the metal layer 6 is 500 μm or less. The heating section 5 is heated by supplying an electric current thereto with a pair of current introducing terminals (not shown), and some of the introduced electrons can be emitted from the electron emitting portion 4.

FIG. 3 is a cross-sectional view along the III-III arrow in FIG. 2. As shown in FIG. 3, the diamond electron emission cathode 10 has an electron emitting portion 4 and a heating section 5. The diamond electron emission cathode 10 is formed by covering the entire surface of the diamond semiconductor 3 with a metal layer 6. The diamond semiconductor 3 is constituted of a p-type semiconductor diamond comprising p-type impurities at $2 \times 10^{15}$ cm$^{-3}$ or higher. The electron emitting portion 4 is constituted of a p-type semiconductor diamond 3.

FIG. 4 is a cross-sectional view along the III-III arrow in FIG. 2 that shows a diamond electron emission cathode other than the diamond electron emission cathode 10 shown in FIG. 3. A specific feature of this cathode is that it is composed of at least two types of semiconductors with different electric properties. As shown in FIG. 4, the diamond electron emission cathode 10 has an electron emitting portion 4 and a heating section 5. The diamond electron emission cathode 10 is constituted by covering the entire outer periphery of the diamond semiconductor surface with a metal layer 6. A diamond semiconductor 13 is a p-type semiconductor diamond comprising p-type impurities at $2\times10^{15}$ cm$^{-3}$ or higher, and a semiconductor 16 of another type is an intrinsic semiconductor with a carrier concentration of $1\times10^9$ cm$^{-3}$ or lower at 300 K. The intrinsic semiconductor 16 is present in the electron emitting portion 4.

Another embodiment of the diamond electron emission cathode will be described below based on FIG. 3. This diamond electron emission cathode 10 uses single crystal diamond in at least part thereof. A natural single crystal, a single crystal artificially synthesized by a high-temperature high-pressure synthesis method or vapor phase synthesis method, or a combination of such single crystals can be used as the single crystal diamond. The diamond electron emission cathode 10 is constituted of n-type semiconductor diamond.

FIG. 4 shows yet another diamond electron emission cathode 10. A specific feature of this cathode is that it is composed of at least two types of semiconductors with different electric properties. As shown in FIG. 4, the diamond electron emission cathode 10 has an electron emitting portion 4 and a heating section 5. The diamond electron emission cathode 10 is constituted by covering the entire outer periphery of the diamond semiconductor surface with a metal layer 6. A diamond semiconductor 13 is an n-type semiconductor diamond comprising n-type impurities at $2\times10^{15}$ cm$^{-3}$ or higher, and a semiconductor 16 of another type is an intrinsic semiconductor with a carrier concentration of $1\times10^9$ cm$^{-3}$ or lower at 300 K. The intrinsic semiconductor 16 is present in the electron emitting portion 4.

Yet another embodiment of the diamond electron emission cathode will be described below based on FIG. 3. This diamond electron emission cathode 10 uses single crystal diamond in at least part thereof. A natural single crystal, a single crystal artificially synthesized by a high-temperature high-pressure synthesis method or vapor phase synthesis method, or a combination of such single crystals can be used as the single crystal diamond. The diamond electron emission cathode 10 is constituted of intrinsic semiconductor diamond.

As shown in FIG. 3, the diamond electron emission cathode 10 has one electron emitting portion 4 and a heating section 5. The diamond electron emission cathode 10 is formed by covering the entire outer periphery of the surface of a diamond semiconductor 3 with a metal layer 6. The diamond semiconductor 3 is constituted of an intrinsic semiconductor 3 with a carrier concentration of $1\times10^9$ cm$^{-3}$ or lower at 300 K. The electron emitting portion 4 is constituted of the intrinsic semiconductor 3.

FIG. 5 is a perspective view illustrating yet another embodiment of the diamond electron emission cathode in accordance with the present invention. This diamond electron emission cathode 30 uses single crystal diamond in at least part thereof. A natural single crystal, a single crystal artificially synthesized by a high-temperature high-pressure synthesis method or vapor phase synthesis method, or a combination of such single crystals can be used as the single crystal diamond.

As shown in FIG. 5, the diamond electron emission cathode 30 is configured to have a columnar shape with a sharpened acute section having one electron emitting portion 34. A metal layer 36 is formed on the surface of the diamond electron emission cathode 30.

FIG. 6 is a three-plane view illustrating the diamond electron emission cathode 30 shown in FIG. 5. FIG. 6(*a*) is a plan view, (b) is a front view, (c) is a right side view. The diamond electron emission cathode 30 shown in a plan view of FIG. 6 has the electron emitting portion 34. The entire outer peripheral surface of the diamond electron emission cathode 30 is covered with the metal layer 36.

Specific features of such cathode are that, as shown in FIG. 6(*c*), the shortest distance (1) from the distal end of the electron emitting portion 34 to an end portion of the metal layer 36 is 500 μm or less, heating is performed by supplying an electric current with a pair of current introducing terminals (not shown in the figures), and some of the introduced electrons can be emitted from the electron emitting portion 34.

FIG. 7 is a cross-sectional view along the VII-VII arrow in FIG. 6. As shown in FIG. 7, the electron emitting portion 34 is formed in the diamond electron emission cathode 30. The diamond electron emission cathode 30 is formed by coating part of the surface of the diamond semiconductor 33 with a metal layer 36. The diamond semiconductor 33 is constituted of p-type semiconductor diamond comprising p-type impurities at $2\times10^{15}$ cm$^{-3}$ or higher. A semiconductor 37 of another type is an intrinsic semiconductor with a carrier concentration of $1\times10^9$ cm$^{-3}$ or lower at 300 K. The electron emitting portion 34 is constituted of intrinsic semiconductor diamond 37.

Yet another diamond electron emission cathode 30 will be explained below based on FIG. 7. As shown in FIG. 7, an electron emitting portion 34 is formed in the diamond electron emission cathode 30. The diamond electron emission cathode 30 is formed by coating part of the surface of a diamond semiconductor 33 with a metal layer 36. The diamond semiconductor 33 is constituted of n-type semiconductor diamond comprising n-type impurities at $2\times10^{15}$ cm$^{-3}$ or higher. A semiconductor 37 of another type is an intrinsic semiconductor with a carrier concentration of $1\times10^9$ cm$^{-3}$ or lower at 300 K. The electron emitting portion 34 is constituted of the intrinsic semiconductor diamond.

The explanation above was conducted with reference to FIG. 1 to FIG. 7, but the shape of the electron emitting portion is not limited to the rectangular pyramid shape such as shown in FIG. 1 to FIG. 7 and may be, for example, a conical or triangular pyramidal shape.

FIG. 8 is a cross-sectional view of a diamond electron emission source in accordance with the present invention. The diamond electron emission source has a structure comprising the diamond electron emission cathode 40 in accordance with the present invention, an insulating ceramic 41, and a pair of support cathodes (current introducing terminals) 42, 42 for supplying an electric current to the diamond electron emission cathode 40, wherein the support terminals 42, 42 are in direct contact with the diamond electron emission cathode 40. When the electric resistance value between the terminals is 10 Ω or more to 3 kΩ or less, the performance of the diamond electron emission source can be fully demonstrated even with a power source system of an electron beam device using the conventional cathode materials have been used.

A metal with a high melting point such as Mo, Nb, W, Ta, or alloys thereof can be advantageously used as a material for the support terminals. Alternatively, even a metal with a melting point of 1700 K or less can be advantageously used for the support terminals. Because diamond can emit electrons at a lower temperature than W filaments, LaB$_6$, or ZrO/W, etc., a metal with a low melting point can be used. In this case, the electron emission source can be constructed at a low cost, using a low-cost metal material. Because the diamond electron emission cathode does not reach with the support terminals as, for example, hexaborides such as LaB$_6$ do, even at a high temperature under electron emission, the cathode can be clamped by direct contact. With the above-described structure of the diamond electron emission source, the diamond electron emission source may be installed very easily as a replacement in electron beam devices where the conventional materials, such as W filaments, $LaB_6$, or sharpened W, ZrO/W, have been used. Moreover, because of a structure in which the diamond electron emission cathode is directly clamped by the support terminals, the alignment of optical axes during fabrication is facilitated and the possibility of displacement or separation during use is low. Furthermore, an electric resistance of 3 kΩ or less between the terminals at room temperature is desirable for attaching the diamond electron emission cathode to an electron beam devices where the conventional cathode materials have been used. At a higher resistance value, there is a strong possibility that sufficient electron emission characteristics will not be obtained with the power source of the electron beam device.

The electron microscope in accordance with the present invention has therein the diamond electron emission cathode or diamond electron emission source in accordance with the present invention and enables observations at a higher magnification ratio than the electron microscopes using the conventional cathode materials. When the diamond electron emission cathode in accordance with the present invention is so shaped that it can be used as a thermal electron emission cathode and installed in an electron microscope, observations of fine configurations can be performed at a magnification ratio higher than that attained when $LaB_6$ is used. When the diamond electron emission cathode is so shaped that it can be used as a thermal field-emission cathode and installed in an electron microscope, observations of fine configurations can be performed at a magnification ratio higher than that attained when ZrO/W is used. Alternatively, when the diamond electron emission cathode is so shaped that it can be used as a field-emission cathode and installed in an electron microscope, observations of fine configurations can be performed at a magnification ratio higher than that attained when sharpened W is used.

The electron beam exposure device in accordance with the present invention has installed therein the diamond electron emission cathode or diamond electron emission source in accordance with the present invention and enables the drawing of fine patterns with a throughput higher than that of electron beam exposure devices using the conventional cathode materials. When the diamond electron emission cathode in accordance with the present invention is so shaped that it can be used as a thermal electron emission cathode and installed in an electron beam exposure device, fine patterns can be drawn with a throughput higher than that attained when $LaB_6$ is used. When the diamond electron emission cathode is so shaped that it can be used as a thermal field-emission cathode and installed in an electron beam exposure device, fine patterns can be drawn with a throughput higher than that attained when ZrO/W is used.

EXAMPLES

Fabrication of samples for evaluating thermal electron emission characteristic

Sample I

A single crystal diamond (p-type semiconductor diamond) in the form of elongated rectangular parallelepiped was prepared by high-pressure high-temperature synthesis. The diamond contained boron at $5 \times 10^{19}/cm^3$. The tip end was sharpened by polishing, and the curvature radius of the tip end was 10 µm. The size was 0.5×0.5×2.5 mm, and the aspect ratio was 5.

The plane orientation of the electron emitting portion formed by polishing was nearly (111) plane, and the maximum orientation displacement was about 3.4 degrees. The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 2. In FIG. 2, l was 400 µm.

Sample II

A single crystal diamond (n-type semiconductor diamond) in the form of elongated rectangular parallelepiped was prepared by CVD. The diamond contained phosphorus at $5 \times 10^{19}/cm^3$. The specific resistance evaluated at 300 K was 240 Ωcm. The tip end was sharpened by polishing, and the curvature radius of the tip end was about 5 µm. The size was 0.4×0.4×2.6 mm, and the aspect ratio was 6.5.

The plane orientation of the electron emitting portion formed by polishing was nearly (111) plane, and the maximum orientation displacement was about 2.8 degrees. The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 2. In FIG. 2, l was 400 µm.

Sample III

A single crystal diamond (intrinsic semiconductor diamond) in the form of elongated rectangular parallelepiped was prepared by CVD. During growth by CVD, no substance serving as a dopant was intentionally introduced in addition to hydrogen and methane to the gas supplied into the CVD device. Furthermore, the device used had not introduced substances serving as dopants until then. Then concentration of carriers at 300 K was about $8 \times 10^8/cm^3$. The tip end was sharpened by polishing, and the curvature radius of the tip end was about 5 µm. The size was 0.6×0.6×2.4 mm, and the aspect ratio was 4.

The plane orientation of the electron emitting portion formed by polishing was nearly (111) plane, and the maximum orientation displacement was about 4.7 degrees. The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 2. In FIG. 2, l was 400 µm.

Sample IV

A single crystal diamond (p-type semiconductor diamond) in the form of elongated rectangular parallelepiped was prepared by high-pressure high-temperature synthesis. The diamond contained boron at $5 \times 10^{19}/cm^3$. The tip end was sharpened by polishing, and the curvature radius of the tip end was 3 µm. The size was 0.5×0.5×2.5 mm, and the aspect ratio was 5.

The plane orientation of the electron emitting portion formed by polishing was nearly (111) plane, and the maximum orientation displacement was about 3.4 degrees. Then, an intrinsic semiconductor layer was formed to a thickness of about 5 µm by a CVD method (FIG. 4). The process was implemented in the CVD device that was used for growing the intrinsic semiconductor diamond of sample III and the growth conditions were the same. Thus, during growth by CVD, no substance serving as a dopant was intentionally introduced in addition to hydrogen and methane to the gas supplied into the CVD device. Furthermore, the device used had not introduced substances serving as impurities until then.

The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 6. In FIG. 6, l was 400 μm.

Sample V

A single crystal diamond (n-type semiconductor diamond) in the form of elongated rectangular parallelepiped was prepared by CVD. The diamond contained phosphorus at $5\times10^{19}/cm^3$. The specific resistance evaluated at 300 K was 24 Ωcm. The tip end was sharpened by polishing, and the curvature radius of the tip end was about 5 μm. The size was 0.4×0.4×2.6 mm, and the aspect ratio was 6.5.

The plane orientation of the electron emitting portion formed by polishing was nearly (111) plane, and the maximum orientation displacement was about 2.9 degrees. Then, an intrinsic semiconductor layer was formed to a thickness of about 5 μm by a CVD method (FIG. 4). The process was implemented in the CVD device that was used for growing the intrinsic semiconductor diamond of sample III and the growth conditions were the same. Thus, during growth by CVD, no substance serving as a dopant was intentionally introduced in addition to hydrogen and methane to the gas supplied into the CVD device. Furthermore, the device used had not introduced substances serving as dopants in the past.

The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 6. In FIG. 6, l was 400 μm.

Sample i

A single crystal diamond (n-type semiconductor diamond) in the form of elongated rectangular parallelepiped was prepared by CVD. The diamond contained phosphorus at $5\times10^{19}/cm^3$. The specific resistance evaluated at 300 K was 240 Ωcm. The tip end was sharpened by polishing, and the curvature radius of the tip end was about 5 μm. The size was 0.4×0.4×2.6 mm, and the aspect ratio was 6.5.

The plane orientation of the electron emitting portion formed by polishing was nearly (111) plane, and the maximum orientation displacement was about 2.9 degrees. The hydrogenation centered on the electron emitting portion was then performed with hydrogen plasma and the surface was terminated with hydrogen. The treatment was hydrogen plasma was typically conducted for about 1 to 3 hours at 800 to 900° C. and at about 80 to 150 Torr. Then, a metallic molybdenum layer was formed in the range shown in FIG. 2. In FIG. 2, l was 900 μm.

Sample ii

A single crystal diamond (n-type semiconductor diamond) in the form of elongated rectangular parallelepiped was prepared by CVD. The diamond contained phosphorus at $5\times10^{19}/cm^3$. The specific resistance evaluated at 300 K was 240 Ωcm. The tip end was sharpened by polishing, and the curvature radius of the tip end was about 50 μm. The size was 0.4×0.4×2.6 mm, and the aspect ratio was 6.5.

The plane orientation of the electron emitting portion formed by polishing was nearly (111) plane, and the maximum orientation displacement was about 10.5 degrees.

Evaluation of thermal electron emission characteristic

The evaluation of thermal electron emission characteristic was performed by using the above-described sample I, II, III, IV, V, i, ii. For comparison, a chip composed of $LaB_6$ was also evaluated.

An electron microscope had an electron gun chamber which was provided with a window to measure the sample temperature and a measurement system was formed such that the emission current, brightness, and energy width could be measured. In the structure shown in FIG. 8, the cathode was clamped by a pair of molybdenum support terminals 42 for introducing an electric current to the heating section, and an electric resistance between the terminals was measured. This structure was then mounted on the electron microscope and an electron emission characteristic was evaluated. In the measurement system, the degree of vacuum was $1\times10^{-8}$ Torr and the acceleration voltage was 15 kV. For comparison, the chip composed of $LaB_6$ was also evaluated. The evaluation results of the samples are shown in Table 1.

TABLE 1

| Thermal electron emission characteristic | Example of the Invention | | | | | Comparative Example | | |
|---|---|---|---|---|---|---|---|---|
| | I | II | III | IV | V | i | ii | $LaB_6$ |
| Distance between tip end and metal layer (μm) | 400 | 400 | 400 | 400 | 400 | 900 | 900 | no |
| Constitution | p | n | i | pi | ni | n | n | — |
| Electron emitting portion | p | n | i | i | i | n | n | — |
| Hydrogen termination | yes | yes | yes | yes | yes | yes | no | — |
| Radius of tip end (μm) | 10 | 5 | 5 | 3 | 5 | 5 | 50 | 10 |
| Protruding structure | no | no | no | no | no | no | no | — |
| Emission temperature (K) | 1150 | 1150 | 1150 | 1150 | 1150 | 1150 | 1150 | 1900 |

TABLE 1-continued

| Thermal electron emission characteristic | Example of the Invention | | | | | Comparative Example | | |
|---|---|---|---|---|---|---|---|---|
| | I | II | III | IV | V | i | ii | $LaB_6$ |
| Resistance between terminals ($\Omega$) | 50 | 250 | 450 | 400 | 480 | 270 | 270 | 2 |
| Emission current ($\mu A$) | 190 | 170 | 120 | 210 | 175 | 25 | 3 | 70 |
| Energy width (eV) | 0.55 | 0.55 | 0.55 | 0.55 | 0.55 | 0.55 | 0.55 | 1.2 |
| Initial brightness (A/cm$^2$sr) | $5 \times 10^7$ | $2 \times 10^7$ | $1 \times 10^7$ | $2 \times 10^8$ | $4 \times 10^7$ | $1 \times 10^6$ | $2 \times 10^5$ | $6 \times 10^5$ |

In samples I-V, the electron emission characteristic was superior to that of $LaB_6$. In sample i, because the distance between the metal cover layer and electron emitting portion was as large as 900 µm, the electron transport efficiency from the terminal for introducing an electric current to the electron emitting portion was low. As a result, the electron emission characteristic was lower than those obtained in samples I to V. In sample ii, in addition, no hydrogen termination of the electron emitting portion was present. As a result, the electron emission characteristic was even lower.

Diamond electron emission cathodes similar to those of samples I-V were fabricated and evaluated in the same manner as described above, except that the material of support terminals 42 was changed to SUS304 having which has a melting point of less than 1700 K, and the results obtained were identical to those obtained by using Mo. Furthermore, the diamond electron emission cathodes of samples I-V were installed in an electron microscope and used for observing fine structures. The observations could be conducted at a magnification ratio higher than that attained with $LaB_6$. Furthermore, the diamond electron emission cathodes identical to those of samples I-V were mounted on electron beam exposure devices. Fine patterns could be drawn with a higher throughput than with $LaB_6$.

Fabrication of samples for evaluating thermal field emission characteristic

Samples A-E

Samples A-E were fabricated by the fabrication method identical to those of samples I-V. Polishing was conducted attentively and with better accuracy to obtain a tip end radius in all the samples of 2 µm.

Sample B'

Similarly to sample B, a single crystal diamond (n-type semiconductor diamond) in the form of elongated rectangular parallelepiped was prepared by CVD. The diamond contained phosphorus at $5 \times 10^{19}$/cm$^3$. The specific resistance evaluated at 300 K was 240 $\Omega$cm. The tip end was sharpened by polishing, and the curvature radius of the tip end was about 5 µm. The size was 0.4×0.4×2.6 mm, and the aspect ratio was 6.5.

The plane orientation of the electron emitting portion formed by polishing was nearly (111) plane, and the maximum orientation displacement was about 2.1 degrees. The electron emitting portion was further subjected to FIB processing and a protruding structure with a tip end diameter of 1 µm, a height of 3 µm, and an aspect ratio of 3 was formed as an electron emitting portion such as shown in FIG. 9.

The hydrogenation centered on the electron emitting portion was then performed with hydrogen plasma and the surface was terminated with hydrogen. The treatment with hydrogen plasma was typically conducted for about 1 to 3 hours at 800 to 900° C. and at about 80 to 150 Torr. Then, a metallic molybdenum layer was formed in the range shown in FIG. 9. In FIG. 9, l was 400 µm.

Samples a, b

Samples a, b were fabricated by the fabrication method identical to those of samples i, ii. For the sample a, polishing was conducted attentively and with better accuracy to obtain a tip end radius in all the samples of 2 µm.

[Evaluation of Thermal Filed Emission Characteristic]

Samples A-E, B', a, b were clamped by a pair of molybdenum support terminals 42, as shown by the structure in FIG. 8, for introducing an electric current to the heating section, and an electric resistance between the terminals was measured. Then, each sample was mounted on the electron microscope and an electron emission characteristic was evaluated. In the measurement system, the degree of vacuum was $1 \times 10^{-9}$ Torr and the acceleration voltage was 15 kV. For comparison, a chip composed of ZrO/W was also evaluated. The evaluation results of the samples are shown in Table 2.

TABLE 2

| Thermal field emission characteristic | Example of the Invention | | | | | | Comparative Example | | |
|---|---|---|---|---|---|---|---|---|---|
| | A | B | C | D | E | B' | a | b | ZrO/W |
| Distance between tip end of metal layer (µm) | 400 | 400 | 400 | 400 | 400 | 400 | 900 | 900 | — |

TABLE 2-continued

| Thermal field emission characteristic | Example of the Invention | | | | | | Comparative Example | | |
|---|---|---|---|---|---|---|---|---|---|
| | A | B | C | D | E | B' | a | b | ZrO/W |
| Constitution | p | n | i | pi | ni | n | n | n | — |
| Electron emitting portion | p | n | i | i | i | n | n | n | — |
| Hydrogen termination | yes | yes | yes | yes | yes | yes | yes | no | — |
| Radius of tip end (μm) | 2 | 2 | 2 | 2 | 2 | 1 | 2 | 50 | 1 |
| Protruding structure | no | no | no | no | no | yes | no | no | — |
| Emission temperature (K) | 1000 | 1000 | 1000 | 1000 | 1000 | 1000 | 1000 | 1000 | 1800 |
| Resistance between terminals (Ω) | 50 | 250 | 450 | 400 | 480 | 240 | 270 | 270 | 1 |
| Emission current (μA) | 410 | 320 | 290 | 480 | 400 | 550 | 65 | 10 | 190 |
| Energy width (eV) | 0.4 | 0.4 | 0.4 | 0.4 | 0.4 | 0.35 | 0.4 | 0.4 | 0.6 |
| Initial brightness (A/cm²sr) | $8 \times 10^7$ | $6 \times 10^7$ | $5 \times 10^7$ | $1 \times 10^8$ | $7 \times 10^7$ | $2 \times 10^8$ | $1 \times 10^7$ | $2 \times 10^6$ | $3 \times 10^7$ |

*Diameter of tip end of the protruding structure.

In samples A-E, the electron emission characteristic was superior to that of ZrO/W. In sample a, because the distance between the metal cover layer and electron emitting portion was as large as 900 μm, the electron transport efficiency from the terminal for introducing an electric current to the electron emitting portion was low. As a result, the electron emission characteristic was lower than those obtained in samples A-E. In sample b, in addition, no hydrogen termination of the electron emitting portion was present and the tip end radius was large. As a result, the electron emission characteristic was even lower. In sample B', due of a small tip end diameter and the protruding structure, the concentration of electric field was enhanced, the electric field applied to the electron emitting portion was increased, and the electron emission characteristic was improved.

Diamond electron emission cathodes identical to those of samples A-E, B' were fabricated and evaluated in the same manner as described above, except that the material of support terminals 42 was changed to SUS304 having a melting point of less than 1700 K, and the results obtained were identical to those obtained by using Mo. Furthermore, the diamond electron emission cathodes of samples A-E, B' were installed in an electron microscope and used for observing fine structures. The observations could be conducted at a magnification ratio higher than that attained with ZrO/W. Furthermore, the diamond electron emission cathodes identical to those of samples A-E were mounted on electron beam exposure devices. Fine patterns could be drawn with a higher throughput than with ZrO/W.

Figure 1:
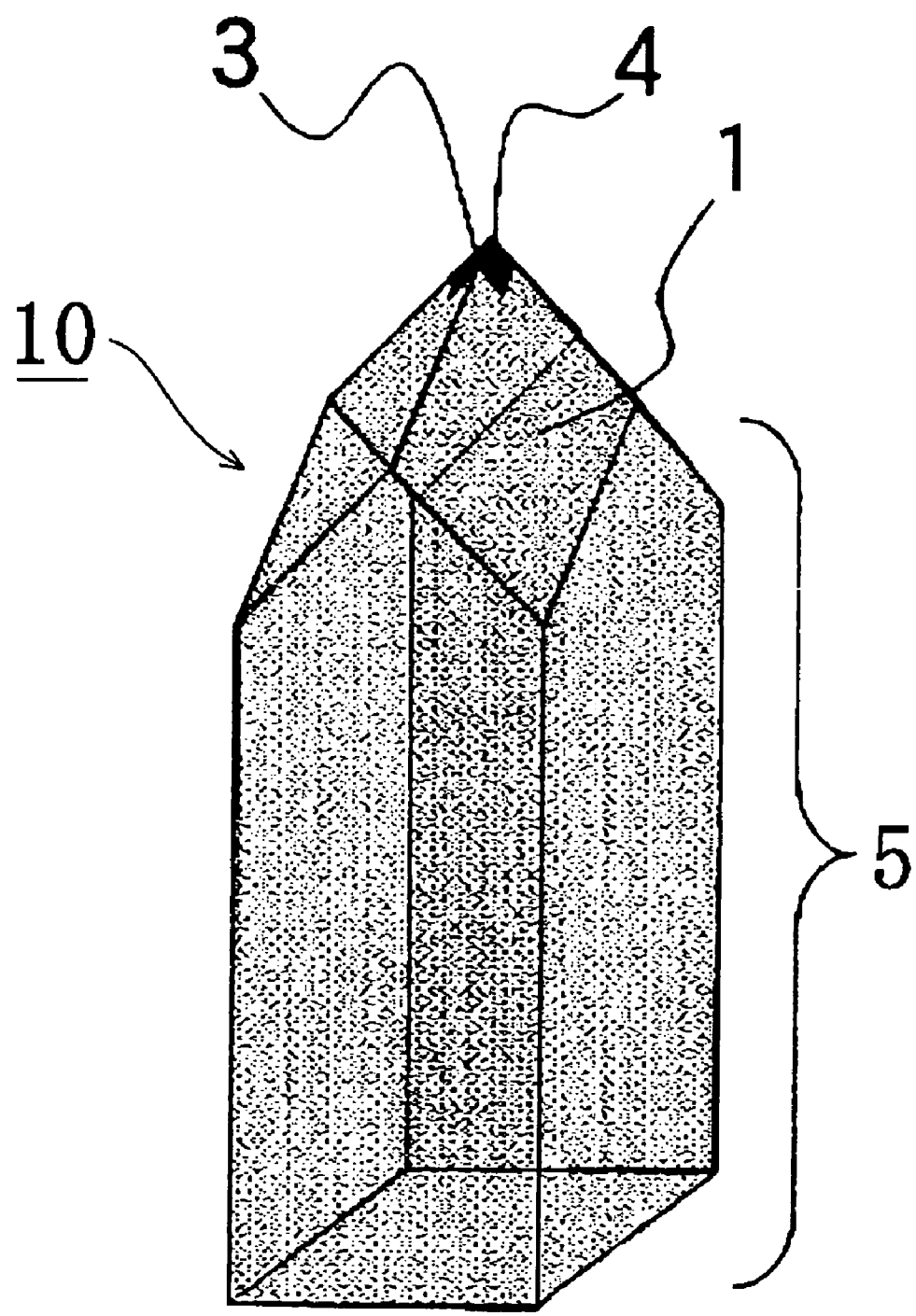
FIG. 1 is a perspective view illustrating an embodiment of the diamond electron emission cathode in accordance with the present invention.
Figure 2:
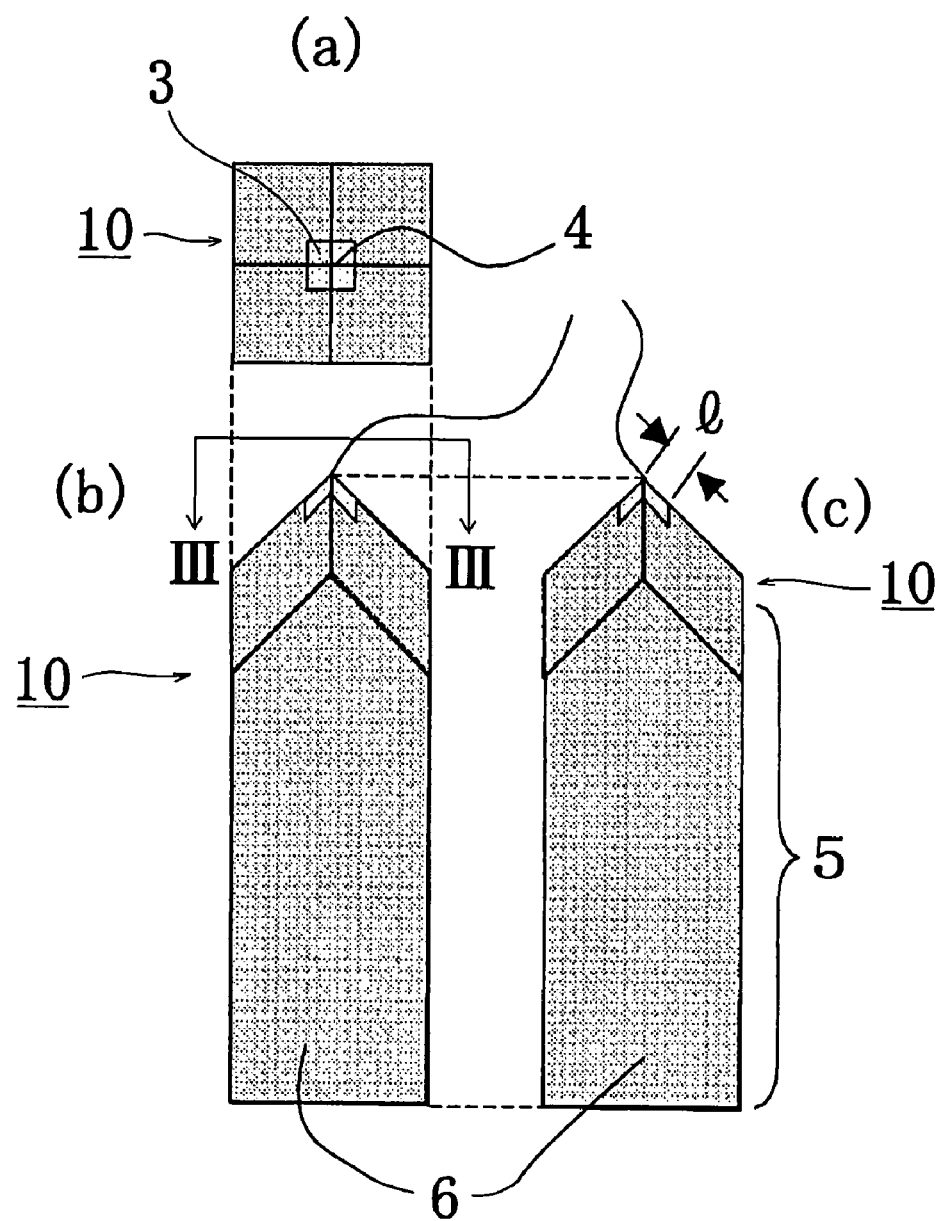
FIG. 2 is a three-plane view illustrating an embodiment of the diamond electron emission cathode in accordance with the present invention.
Figure 3:
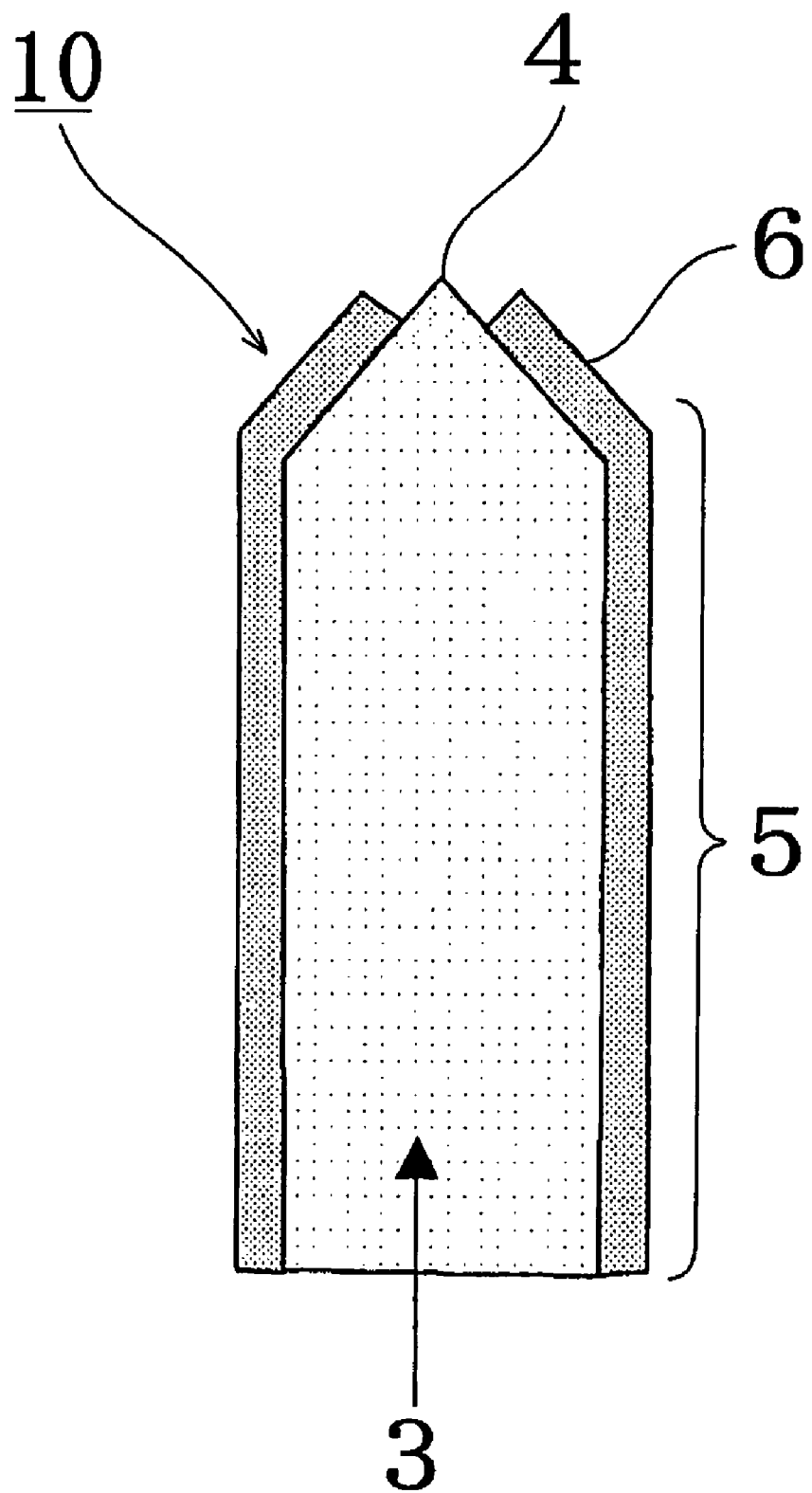
FIG. 3 is a cross-sectional view along the III-III arrow in FIG. 2.
Figure 4:
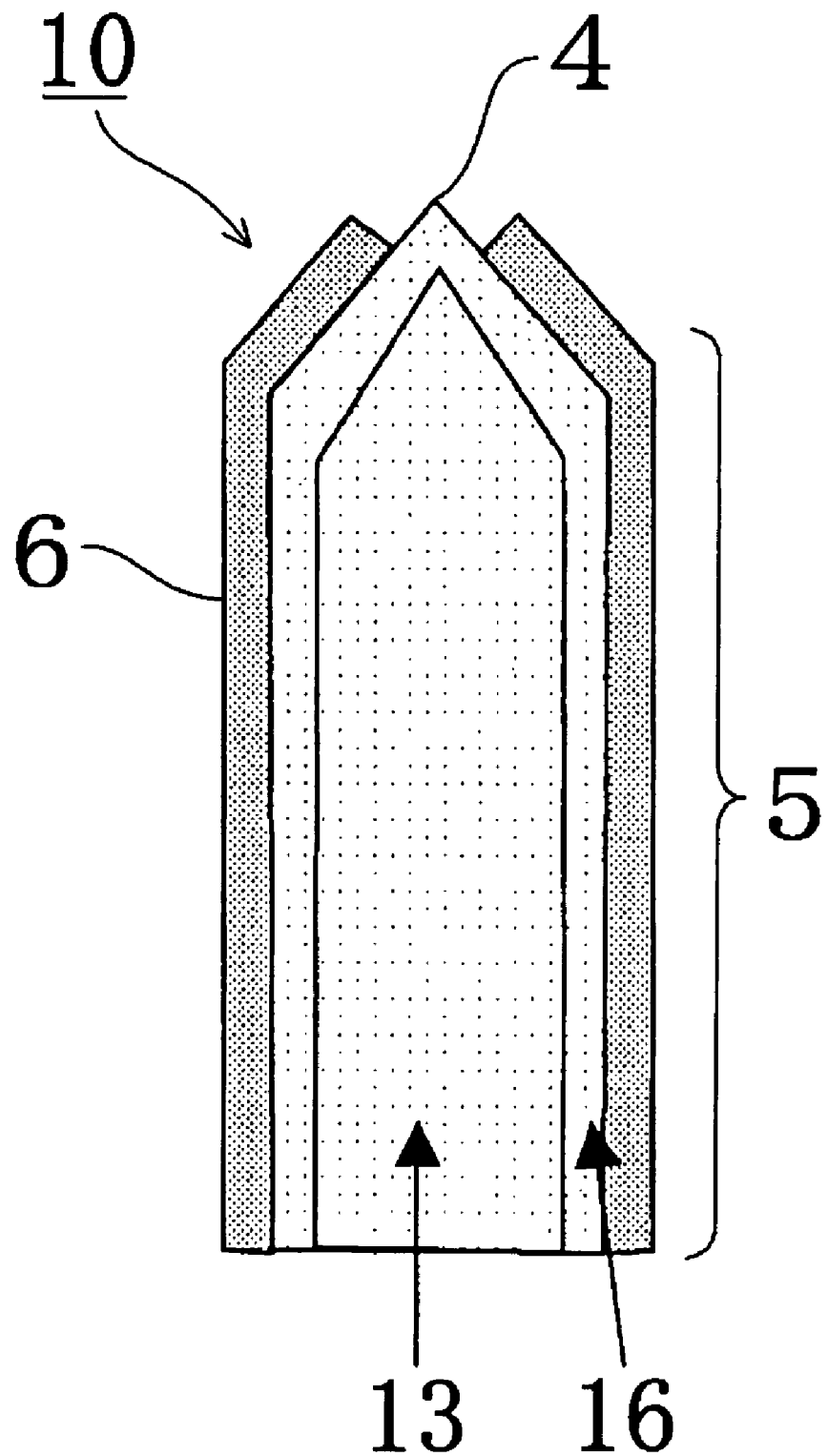
FIG. 4 is a cross-sectional view along the III-III arrow in FIG. 2 that illustrates another example of the diamond electron emission cathode in accordance with the present invention.
Figure 5:
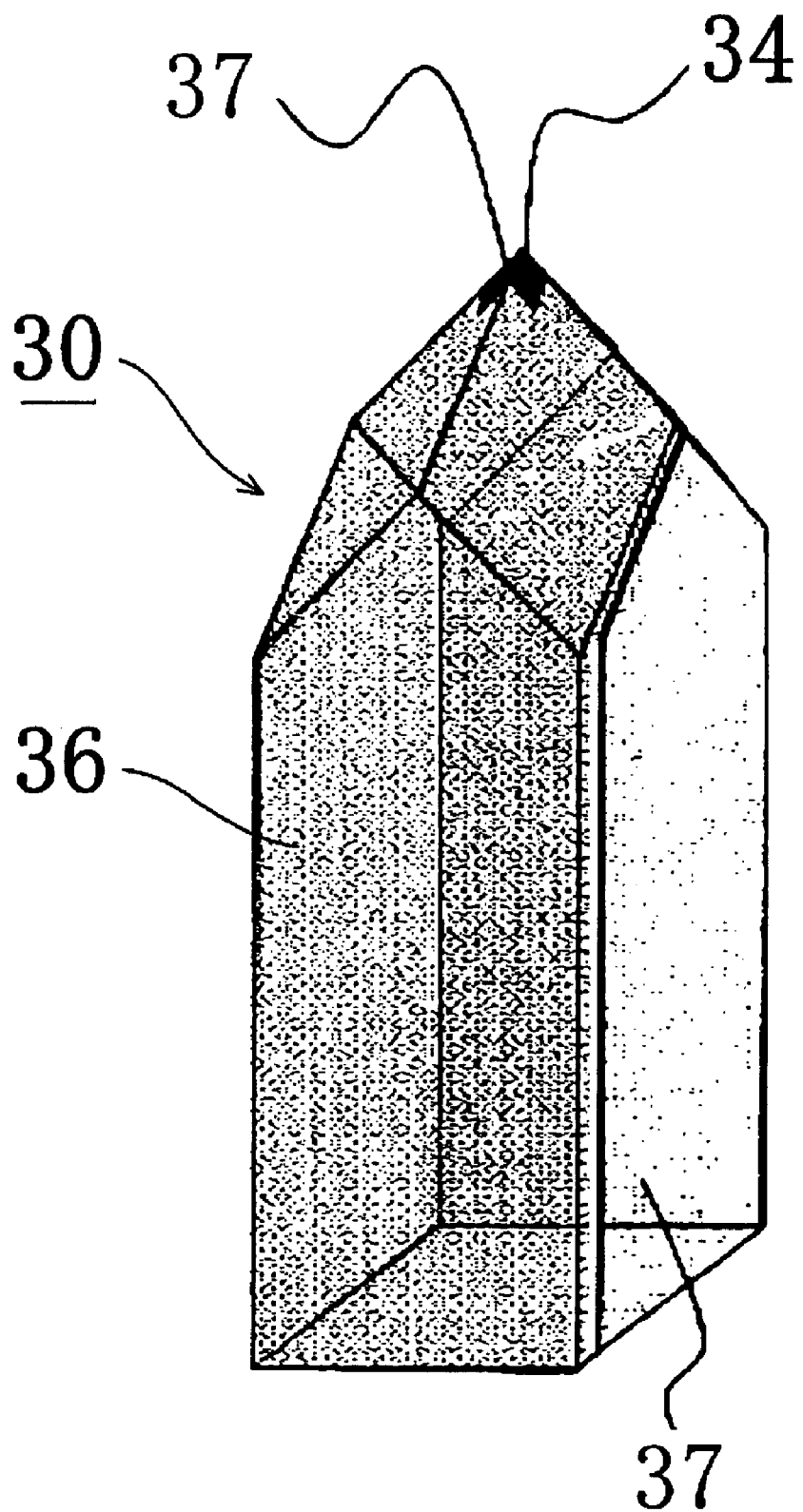
FIG. 5 is a perspective view illustrating another embodiment of the diamond electron emission cathode in accordance with the present invention.
Figure 6:
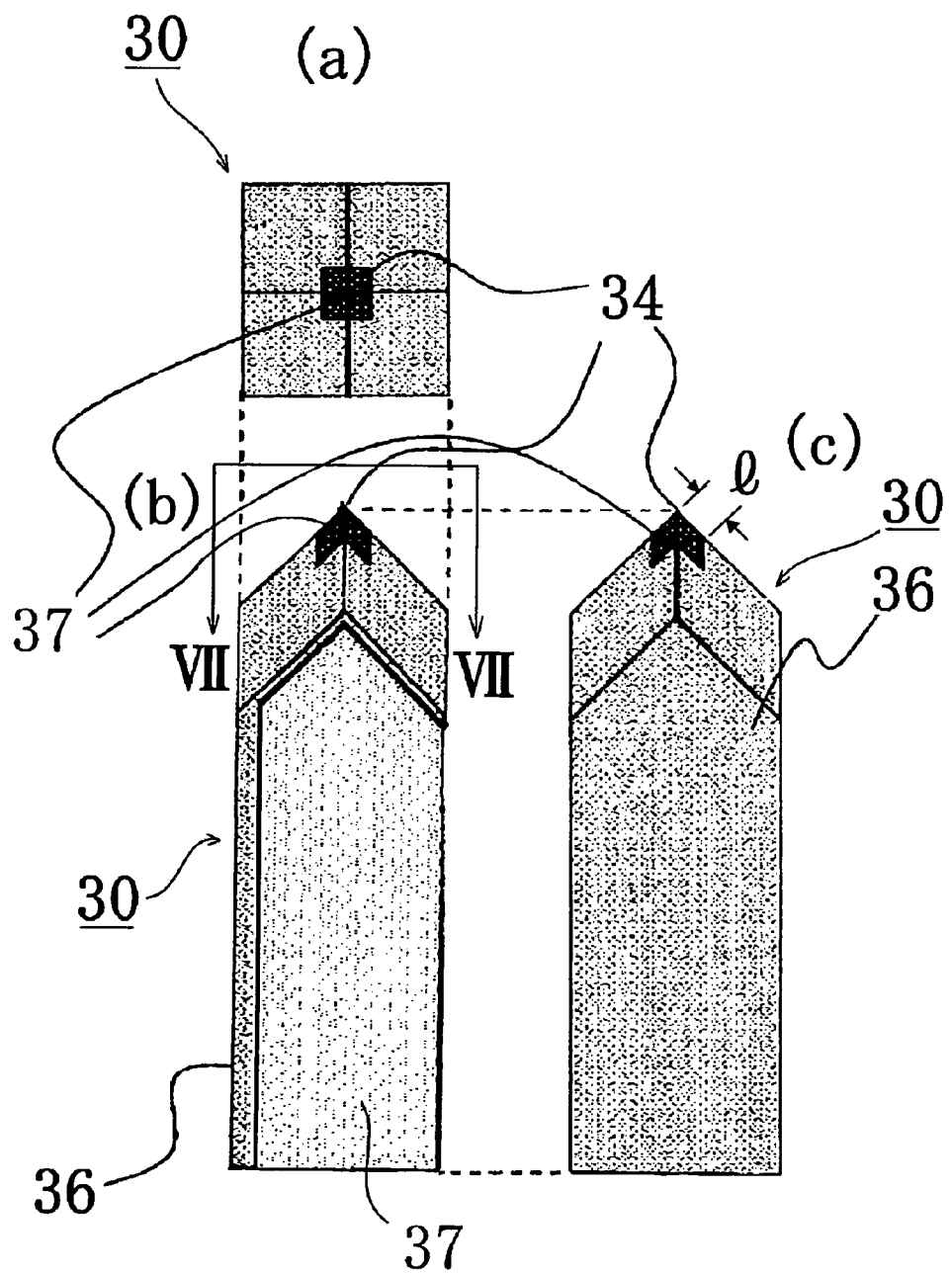
FIG. 6 is a three-plane view illustrating another embodiment of the diamond electron emission cathode in accordance with the present invention.
Figure 7:
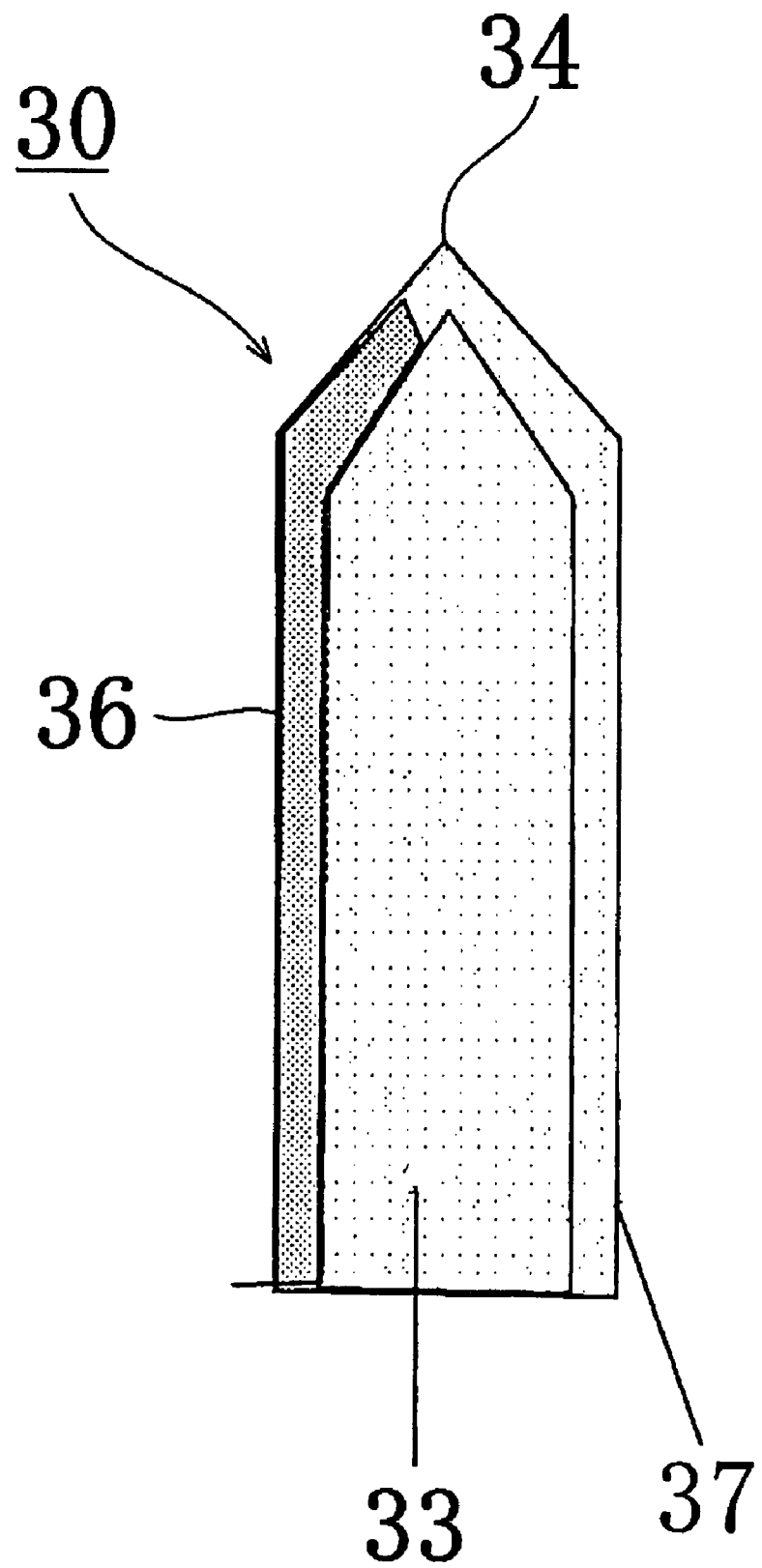
FIG. 7 is a cross-sectional view along the VII-VII arrow in FIG. 6.
Figure 8:
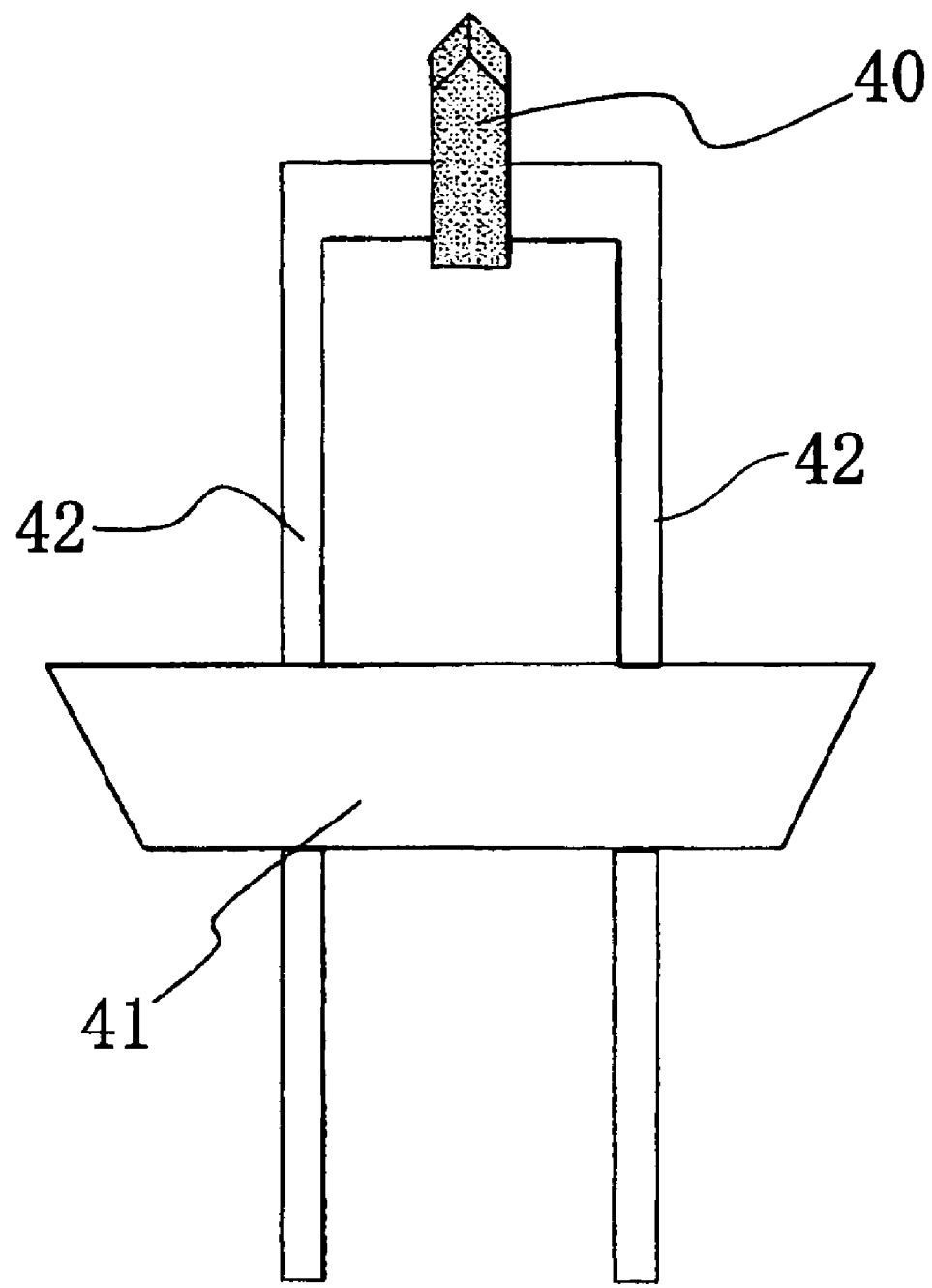
FIG. 8 illustrates an example of the diamond electron emission source in accordance with the present invention.
Figure 9:
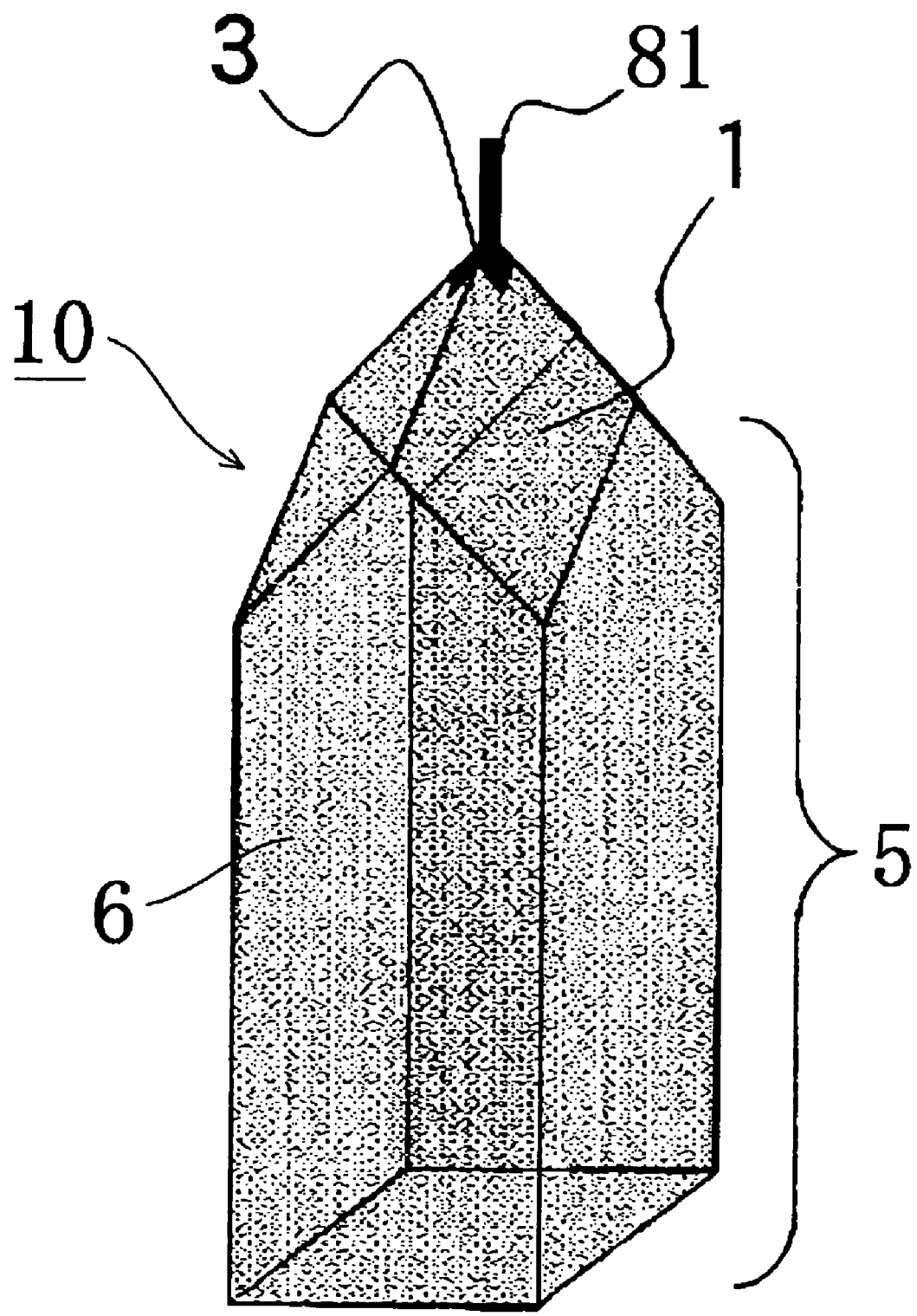
FIG. 9 illustrates an embodiment of another diamond electron emission source in accordance with the present invention.

| Explanation of Reference Numerals | |
|---|---|
| 10, 30, 40: | diamond electron emission cathode |
| 4, 34: | electron emitting portion |
| 6, 36: | metal layer |
| 5: | heating section |
| 3, 13, 33: | diamond semiconductor |
| 16: | intrinsic diamond semiconductor |
| 41: | insulating ceramic |
| 42: | support terminal |

The invention claimed is:

1. A diamond electron emission cathode comprising single crystal diamond in at least part thereof, wherein said diamond electron emission cathode has a columnar shape formed by a sharpened acute section and a heating section, one electron emitting portion is provided in said sharpened acute section, said electron emitting portion and said heating section comprise a diamond semiconductor, said diamond semiconductor is a p-type semiconductor comprising p-type impurities at $2\times10^{15}$ cm$^{-3}$ or higher, said semiconductor is present in said electron emitting portion, a metal layer is formed on a surface of said electron emission cathode, said metal layer is present in at least part of said heating section, the shortest distance from said electron emitting portion to an end portion of the metal layer is 500 μm or less, an electric current for heating is supplied to said heating section with a pair of current introducing terminals, and some of the introduced electrons can be emitted from said electron emitting portion.

2. A diamond electron emission cathode comprising single crystal diamond in at least part thereof, wherein said diamond electron emission cathode has a columnar shape formed by a sharpened acute section and a heating section, one electron emitting portion is provided in said sharpened acute section, said electron emitting portion and said heating section comprise a diamond semiconductor, said diamond semiconductor is an n-type semiconductor comprising n-type impurities at $2\times10^{15}$ cm$^{-3}$ or higher, said semiconductor is present in said electron emitting portion, a metal layer is formed on a surface of said electron emission cathode, said metal layer is present in at least part of said heating section, the shortest distance from said electron emitting portion to an end portion of the metal layer is 500 μm or less, an electric current for heating is supplied to said heating section with a pair of current introducing terminals, and some of the introduced electrons can be emitted from said electron emitting portion.

3. A diamond electron emission cathode comprising single crystal diamond in at least part thereof, wherein said diamond electron emission cathode has a columnar shape formed by a sharpened acute section and a heating section, one electron emitting portion is provided in said sharpened acute section, said electron emitting portion and said heating section comprise a diamond semiconductor, said diamond semiconductor is an intrinsic semiconductor with a carrier concentration of $1\times10^9$ cm$^{-3}$ or lower, said semiconductor is present in said electron emitting portion, a metal layer is formed on a surface of said electron emission cathode, said metal layer is present in at least part of said heating section, the shortest distance from said electron emitting portion to an end portion of the metal layer is 500 μm or less, an electric current is supplied to said heating section with a pair of current introducing terminals, and some of the introduced electrons can be emitted from said electron emitting portion.

4. A diamond electron emission cathode comprising single crystal diamond in at least part thereof, wherein said diamond electron emission cathode has a columnar shape formed by a sharpened acute section and a heating section, one electron emitting portion is provided in said sharpened acute section, said electron emitting portion and said heating section are formed by at least two types of diamond semiconductors that differ in electric properties, one of the types constituting said diamond semiconductors is a p-type semiconductor comprising p-type impurities at $2\times10^{15}$ cm$^{-3}$ or higher, the other one is an intrinsic semiconductor with a carrier concentration of $1\times10^9$ cm$^{-3}$ or lower, said intrinsic semiconductor is present in said electron emitting portion, a metal layer is formed on a surface of said electron emission cathode, said metal layer is present in at least part of said heating section, the shortest distance from said electron emitting portion to an end portion of the metal layer is 500 μm or less, an electric current for heating is supplied to said heating section with a pair of current introducing terminals, and some of the introduced electrons can be emitted from said electron emitting portion.

5. A diamond electron emission cathode comprising single crystal diamond in at least part thereof, wherein said diamond electron emission cathode has a columnar shape formed by a sharpened acute section and a heating section, one electron emitting portion is provided in said sharpened acute section, said electron emitting portion and said heating section are formed by at least two types of diamond semiconductors that differ in electric properties, one of the types constituting said diamond semiconductors is an n-type semiconductor comprising n-type impurities at $2\times10^{15}$ cm$^{-3}$ or higher, the other type is an intrinsic semiconductor with a carrier concentration of $1\times10^9$ cm$^{-3}$ or lower, said intrinsic semiconductor is present in said electron emitting portion, a metal layer is formed on a surface of said electron emission cathode, said metal layer is present in at least part of said heating section, the shortest distance from said electron emitting portion to an end portion of the metal layer is 500 μm or less, an electric current for heating is supplied to said heating section with a pair of current introducing terminals, and some of the introduced electrons can be emitted from said electron emitting portion.

6. The diamond electron emission cathode according to claim 1, wherein the length in the short side direction of said diamond electron emission cathode is 0.05 mm or more to 2 mm or less, and the aspect ratio is 1 or more.

7. The diamond electron emission cathode according to claim 1, wherein at least one plane of a plurality of planes which form the electron emitting portion as an apex in said sharpened acute section is formed by a (111) crystal plane including off-planes within ±7° from a (111) just plane.

8. The diamond electron emission cathode according to claim 1, wherein a surface of the semiconductor constituting said electron emitting portion is terminated with hydrogen atoms.

9. The diamond electron emission cathode according to claim 2, wherein a specific resistance of said n-type semiconductor at 300 K is 300 Ωcm or less.

10. The diamond electron emission cathode according to claim 1, wherein a tip end radius or a tip end curvature radius of said sharpened acute section is 30 μm or less.

11. The diamond electron emission cathode according to claim 1, wherein said electron emitting portion has a protruding structure, a tip end diameter of the protrusion is 5 μm or less, and an aspect ratio thereof is 2 or more.

12. The diamond electron emission cathode according to claim 1, wherein a temperature during electron emission from said electron emitting portion is 400 K or more to 1200 K or less.

13. The diamond electron emission cathode according to claim 1, wherein an electron beam with an energy width of 0.6 eV of less is emitted from said electron emitting portion.

14. A diamond electron emission source having a structure comprising the diamond electron emission cathode according to claim 1, an insulating ceramic, and a pair of terminals for supplying an electric current to said diamond electron emission cathode, wherein a resistance value between the terminals is 10 Ω or more to 3 kΩ or less.

15. The diamond electron emission source according to claim 14, wherein said pair of terminals have a melting point of 1700 K or less.

16. A diamond electron emission source having a structure comprising the diamond electron emission cathode according to claim 1, an insulating ceramic, and a pair of support terminals that clamp said diamond electron emission cathode, fix the cathode to said insulating ceramic, and supply an electric current to said diamond electron emission cathode, wherein said support terminals are in direct contact with said diamond electron emission cathode.

17. The diamond electron emission source according to claim 16, wherein said pair of support terminals have a melting point of 1700 K or less.

18. An electron microscope comprising the diamond electron emission cathode according to claim 1.

19. An electron beam exposure device comprising the diamond electron emission cathode according to claim 1.

20. The diamond electron emission cathode according to claim 2, wherein the length in the short side direction of said diamond electron emission cathode is 0.05 mm or more to 2 mm or less, and the aspect ratio is 1 or more.

21. The diamond electron emission cathode according to claim 2, wherein at least plane of a plurality of planes which form the electron emitting portion as an apex in said sharpened acute section is formed by a (111) crystal plane including off-planes within ±7° from a (111) just plane.

22. The diamond electron emission cathode according to claim 2, wherein a surface of the semiconductor constituting said electron emitting portion is terminated with hydrogen atoms.

23. The diamond electron emission cathode according to claim 2, wherein a tip end radius or a tip end curvature radius of said sharpened acute section is 30 µm or less.

24. The diamond electron emission cathode according to claim 2, wherein said electron emitting portion has a protruding structure, a tip end diameter of the protrusion is 5 µm or less, and an aspect ratio thereof is 2 or more.

25. The diamond electron emission cathode according to claim 2, wherein a temperature during electron emission from said electron emitting portion is 400 K or more to 1200 K or less.

26. The diamond electron emission cathode according to claim 2, wherein an electron beam with an energy width of 0.6 eV of less is emitted from said electron emitting portion.

27. A diamond electron emission source having a structure comprising the diamond electron emission cathode according to claim 2, an insulating ceramic, and a pair of terminals for supplying an electric current to said diamond electron emission cathode, wherein a resistance value between the terminals is 10 Ω or more to 3 kΩ or less.

28. The diamond electron emission source according to claim 27, wherein said pair of terminals have a melting point of 1700 K or less.

29. A diamond electron emission source having a structure comprising the diamond electron emission cathode according to claim 2, an insulating ceramic, and a pair of support terminals that clamp said diamond electron emission cathode, fix the cathode to said insulating ceramic, and supply an electric current to said diamond electron emission cathode, wherein said support terminals are in direct contact with said diamond electron emission cathode.

30. The diamond electron emission source according to claim 29, wherein said pair of support terminals have a melting point of 1700 K or less.

31. An electron microscope comprising the diamond electron emission cathode according to claim 2.

32. An electron beam exposure device comprising the diamond electron emission cathode according to claim 2.

33. The diamond electron emission cathode according to claim 3, wherein the length in the short side direction of said diamond electron emission cathode is 0.05 mm or more to 2 mm or less, and the aspect ratio is 1 or more.

34. The diamond electron emission cathode according to claim 3, wherein at least one plane of a plurality of planes which form the electron emitting portion as an apex in said sharpened acute section is formed by a (111) crystal plane including off-planes within ±7° from a (111) just plane.

35. The diamond electron emission cathode according to claim 3, wherein a surface of the semiconductor constituting said electron emitting portion is terminated with hydrogen atom.

36. The diamond electron emission cathode according to claim 3, wherein a tip end radius or a tip end curvature radius of said sharpened acute section is 30 µm or less.

37. The diamond electron emission cathode according to claim 3, wherein said electron emitting portion has a protruding structure, a tip end diameter of the protrusion is 5 µm or less, and an aspect ratio thereof is 2 or more.

38. The diamond electron emission cathode according to claim 3, wherein a temperature during electron emission from said electron emitting portion is 400 K or more to 1200 K or less.

39. The diamond electron emission cathode according to claim 3, wherein an electron beam with an energy width of 0.6 eV of less is emitted from said electron emitting portion.

40. A diamond electron emission source having a structure comprising the diamond electron emission cathode according to claim 3, an insulating ceramic, and a pair of terminals for supplying an electric current to said diamond electron emission cathode, wherein a resistance value between the terminals is 10 Ω or more to 3 kΩ or less.

41. The diamond electron emission source according to claim 40, wherein said pair of terminals have a melting point of 1700 K or less.

42. A diamond electron emission source having a structure comprising the diamond electron emission cathode according to claim 3, an insulating ceramic, and a pair of support terminals that clamp said diamond electron emission cathode, fix the cathode to said insulating ceramic, and supply an electric current to said diamond electron emission cathode, wherein said support terminals are in direct contact with said diamond electron emission cathode.

43. The diamond electron emission source according to claim 16, wherein said pair of support terminals have a melting point of 1700 K or less.

44. An electron microscope comprising the diamond electron emission cathode according to claim 3.

45. An electron beam exposure device comprising the diamond electron emission cathode according to claim 3.

46. The diamond electron emission cathode according to claim 4, wherein the length in the short side direction of said diamond electron emission cathode is 0.5 mm or more to 2 mm or less, and the aspect ratio is 1 or more.

47. The diamond electron emission cathode according to claim 4, wherein at least one plane of a plurality of planes which form the electron emitting portion as an apex in said sharpened acute section is formed by a (111) crystal plane including off-planes within ±7° from a (111) just plane.

48. The diamond electron emission cathode according to claim 4, wherein a surface of the semiconductor constituting said electron emitting portion is terminated with hydrogen atoms.

49. The diamond electron emission cathode according to claim 4, wherein a tip end radius or a tip end curvature radius of said sharpened acute section is 30 μm or less.

50. The diamond electron emission cathode according to claim 4, wherein said electron emitting portion has a protruding structure, a tip end diameter of the protrusion is 5 μm or less, and an aspect ratio thereof is 2 or more.

51. The diamond electron emission cathode according to claim 4, wherein a temperature during electron emission from said electron emitting portion is 400 K or more to 1200 K or less.

52. The diamond electron emission cathode according to claim 4, wherein an electron beam with an energy width of 0.6 eV of less is emitted from said electron emitting portion.

53. The diamond electron emission cathode according to claim 5, wherein the length in the short side direction of said diamond electron emission cathode is 0.05 mm or more to 2 mm or less, and the aspect ratio is 1 or more.

54. The diamond electron emission cathode according to claim 5, wherein at least one plane of a plurality of planes which form the electron emitting portion as an apex in said sharpened acute section is formed by a (111) crystal plane including off-planes within ±7° from a (111) just plane.

55. The diamond electron emission cathode according to claim 5, wherein a surface of the semiconductor constituting said electron emitting portion is terminated with hydrogen atoms.

56. The diamond electron emission cathode according to claim 5, wherein a specific resistance of said n-type semiconductor at 300 K is 300 Ωcm or less.

57. The diamond electron emission cathode according to claim 5, wherein a tip end radius or a tip end curvature radius of said sharpened acute section is 30 μm or less.

58. The diamond electron emission cathode according to claim 5, wherein said electron emitting portion has a protruding structure, a tip end diameter of the protrusion is 5 μm or less, and an aspect ratio thereof is 2 or more.

59. The diamond electron emission cathode according to claim 5, wherein a temperature during electron emission from said electron emitting portion is 400 K or more to 1200 K or less.

* * * * *